United States Patent
Kawata

[11] Patent Number: 5,999,453
[45] Date of Patent: Dec. 7, 1999

[54] NONVOLATILE SEMICONDUCTOR MEMORY

[75] Inventor: Masato Kawata, Tokyo, Japan

[73] Assignee: NEC Corporation, Japan

[21] Appl. No.: 09/104,953

[22] Filed: Jun. 25, 1998

[30] Foreign Application Priority Data

Jun. 27, 1997 [JP] Japan .................................. 9-171687

[51] Int. Cl.⁶ .......................... G11C 16/04; H01L 29/788
[52] U.S. Cl. ................ 365/185.18; 365/185.03; 257/316; 257/321
[58] Field of Search .............. 365/185.01, 185.03, 365/185.18; 257/316, 318, 319, 321

[56] References Cited

U.S. PATENT DOCUMENTS

| 5,739,568 | 4/1998 | Kojima | 365/185.26 |
| 5,753,950 | 5/1998 | Kojima | 257/315 |
| 5,798,548 | 8/1998 | Fujiwara | 257/319 |

FOREIGN PATENT DOCUMENTS

| 1-161770 | 6/1989 | Japan . | |
| 1212472 | 8/1989 | Japan | H01L 29/78 |
| 5-251711 | 9/1993 | Japan . | |
| 6-77498 | 3/1994 | Japan . | |
| 7-273227 | 10/1995 | Japan . | |
| 8-83855 | 3/1996 | Japan . | |
| 8-204032 | 8/1996 | Japan . | |
| 8-288411 | 11/1996 | Japan . | |

OTHER PUBLICATIONS

M. Ohkawa, et al., "TP 2.3: A 08mm² 3.3V 64Mb Flash Memory With FN–NOR Type 4–level Cell", IEEE, Feb. 8, 1996, pp. 36–37.

*Primary Examiner*—Son Mai

[57] ABSTRACT

A nonvolatile semiconductor memory includes a memory cell constituted by at least first and second floating gates, first and second control gates, and a source and a drain. The first floating gate is formed on a semiconductor substrate through a gate insulating film. The second floating gate is formed on a region without the first floating gate via the gate insulating film. The first control gate is formed on the first floating gate via an insulating film. The second control gate is formed on the second floating gate via the insulating film. The source and the drain are formed in the semiconductor substrate to sandwich the first and second floating gates.

10 Claims, 6 Drawing Sheets

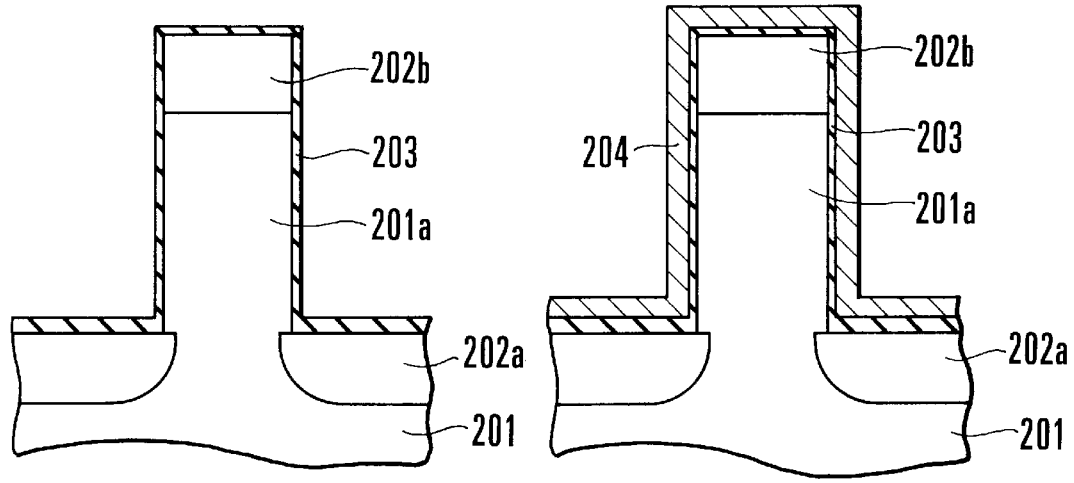
F I G. 4A  F I G. 4B
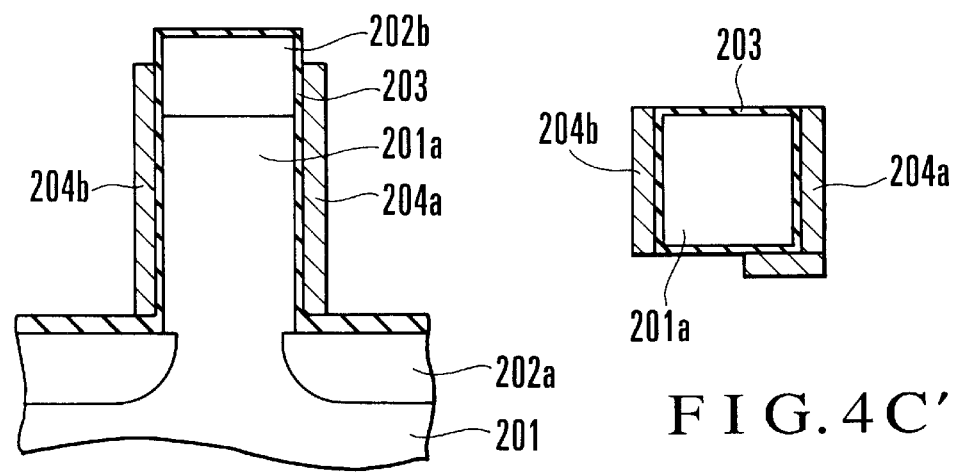
F I G. 4C  F I G. 4C'

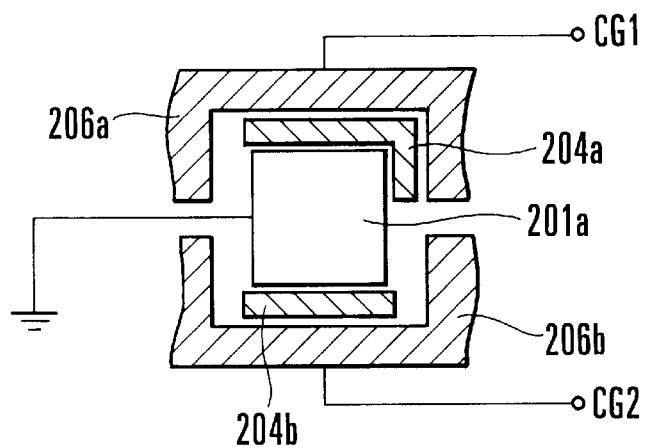
F I G. 5

NONVOLATILE SEMICONDUCTOR MEMORY

BACKGROUND OF THE INVENTION

The present invention relates to a nonvolatile semiconductor memory having a memory cell allowing an electrical data write and erase.

Conventionally, a flash memory which can be erased in blocks has received a great deal of attention as one of electrically programmable and erasable read only memories (EEPROMs) which are classified as one of nonvolatile semiconductor memories. The flash memory cell has a MOS transistor structure wherein a floating gate insulated from the peripheral region is formed between the control gate and the substrate having the channel. Discrimination between data of level "1" and data of level "0" depends on the presence/absence of charges in the floating gate.

Techniques of storing multivalue data in one cell have been conventionally developed. As the first prior art, multivalue data is realized by the circuit operation. In this prior art, the amount of charges to be stored in the floating gate is changed to realize, e.g., quarternary data.

In this case, however, the number of power supplies necessary for realizing multivalue data increases to result in a heavy load on, e.g., a charge pump circuit.

Additionally, to realize multivalue data by the circuit operation, a threshold value range per value must be considerably narrow. For this reason, the amount of charges to be injected into the floating gate must be strictly controlled to result in an increase in load on the controller or write time. This narrow threshold value range also imposes limitations on the margin to a change over time in data holding characteristics to lower reliability. More specifically, when the held charge amount changes along with the elapse of time, the read current changes accordingly, and a data value different from that stored is read.

As the second prior art, in a nonvolatile semiconductor memory, two floating gates and one control gate are arranged in correspondence with one channel (memory cell), and the impurity concentration on the side of the drain continuous to the channel is set to be lower than that on the side of the source continuous to the channel, thereby storing quarternary data in one memory cell (reference 1: Japanese Patent Laid-Open No. 1-212472).

FIG. 6 shows the schematic arrangement of the nonvolatile semiconductor memory. As shown in FIG. 6, in this nonvolatile semiconductor memory, the drain on a semiconductor substrate 701 has an n$^+$-type drain region 702 and an n$^-$-type drain region 709 adjacent to a channel region 704. The channel region 704 is divided into three parts: a channel region 704d near the n$^-$-type drain region 709, a channel region 704s near a source region 703, and a channel region 704c between the channel region 704d and the channel region 704s.

In this nonvolatile semiconductor memory, two floating gates 706d and 706s are insulated from each other. The floating gate 706d is formed on part of the n$^-$-type drain region 709 and the channel region 704d via a gate oxide film 705. The floating gate 706s is formed on part of the n$^+$-type source region 703 and the channel region 704s via the gate oxide film 705. The channel resistance of the n$^-$-type drain region 709 is changed by lowering the impurity concentration relative to the n$^+$-type drain region 702 or the n$^+$-type source region 703.

A control gate 708 is formed on the floating gates 706d and 706s via an insulating film 707 and on the channel region 704c via the gate oxide film 705. The distance between the control gate 708 above the channel region 704c and the semiconductor substrate 701 is almost the same as that between the floating gates 706d and 706s and the semiconductor substrate 701.

The operation of the nonvolatile semiconductor memory with the above arrangement will be described next.

A write is performed by selectively injecting electrons into the floating gates 706d and 706s. Electron injection into the drain-side floating gate 706d will be referred to as a write D. Electron injection into the source-side floating gate 706s will be referred to as a write S.

In the write D, a control gate voltage VG of 12.5 V and a drain voltage VD of 8 V are applied, and the n$^+$-type source region 703 and the semiconductor substrate 701 are grounded. At this time, the channel regions 704d, 704c, and 704s are inverted to flow electrons from the n$^+$-type source region 703 to the n$^-$-type drain region 709. These electrons are accelerated by the voltage between the drain and the source and become hot electrons near the n$^-$-type drain region 709. The hot electrons are attracted by the electric field of the control gate 708 and injected into the floating gate 706d across the energy gap of the gate oxide film 705. When the electrons are selectively injected into the floating gate 706d, the write D is complete.

On the other hand, in the write S, a control gate voltage VG of 12.5 V and a source voltage VS of 8 V are applied, and the n$^+$-type drain region 702 and the semiconductor substrate 701 are grounded. As a result, electrons are selectively injected into the floating gate 706s, as in the above-described case, and the write S is complete.

Even when a voltage of 12.5 V is applied to the memory transistor which has undergone the write D as the control gate voltage VG, and the n$^+$-type drain region 702 and the semiconductor substrate 701 are grounded, the channel regions 704d, 704c, and 704s are inverted. When a voltage of 8 V is applied as the source voltage VS, the write S can be performed without damaging the write D, as in the above-described case. This operation will be referred to as a write D & S.

As described above, as the write state of this nonvolatile semiconductor memory, the write D, the write S, or the write D & S can be selected. When a nonwrite state in added, quarternary data is realized.

In this nonvolatile semiconductor memory, however, the quarternary data is determined using the difference in threshold value and the difference in channel resistance between the write states. A threshold value VT corresponds to the control gate voltage VG at which the drain current starts flowing after gradual voltage application to the control gate. The erase state, the write D state, and the write S state have different threshold values VT of 1 V, 2 V, and 3 V, respectively, but equal conductance characteristics. The write S state and the write D & S state have the same threshold value VT of 3 V, though the conductance characteristics beyond the threshold value are different. Therefore, when the control gate voltage VG is 3 V, the write S cannot be discriminated from the write D & S, so only three values are read. To discriminate the write S from the write D & S, the control gate voltage must be set to be higher than 3 V, and 5 V in the second prior art, using the difference in conductance characteristics. That is, to read quarternary data, a high control gate voltage is required.

In addition, since this nonvolatile semiconductor memory requires, under the control electrode, not only the area for the two floating gates but also some area for the channel region 704c having no floating gate, the area of one cell increases.

As the third prior art, there is an other nonvolatile semiconductor memory having two floating gates per cell which are arranged relatively close to each other, unlike the above-described nonvolatile semiconductor memory (reference 2: Japanese Patent Application No. 6-77498).

In this nonvolatile semiconductor memory, source and drain regions 801 and 802 spaced apart from each other by a predetermined distance are formed in the surface layer of a semiconductor substrate 800 consisting of p-type silicon, as shown in FIG. 7. A floating gate 804 consisting of polysilicon is formed on the channel region between the source and drain regions 801 and 802 via a first gate insulating film 803.

The floating gate 804 is divided into two parts along the channel length. A control gate 806 consisting of polysilicon is formed on divided floating gates 804a and 804b via a second gate insulating film 805.

To erase data in the above arrangement, electrons are extracted from the floating gate 804 or injected into the floating gate 804 at once. Alternatively, the floating gate 804 may be irradiated with a UV ray.

On the other hand, to write data, electrons are selectively injected into the source- and drain-side floating gates 804a and 804b by using F-N tunneling or hot electrons.

With the write, the following four states can be obtained. As the first state, electrons are injected into neither the floating gate 804a nor 804b. As the second state, electrons are injected into the floating gate 804a. As the third state, electrons are injected into the floating gate 804b. As the fourth state, electrons are injected into both the floating gates 804a and 804b.

If the floating gates 804a and 804b have different areas, i.e., the threshold voltage of the memory cell transistor changes, quarternary data can be stored in this memory cell.

In this nonvolatile semiconductor memory, however, since a gap is formed between the two floating gates arranged in the source/drain direction, the channel resistance undesirably increases.

As described above, the conventional techniques of realizing multivalue data by the circuit operation have the following problems.

In the first prior art, the number of power supplies necessary for realizing multivalue data increases to result in a heavy load on, e.g., the charge pump circuit.

To realize multivalue data by the circuit operation, the threshold value range per value must be considerably narrow. For this reason, the amount of charges to be injected into the floating gate must be strictly controlled to result in an increase in load on the controller or write time. This narrow threshold value distribution also imposes limitations on the margin to a change over time in data holding characteristics to lower reliability.

In the second prior art, a high control gate is required to read data, as described above. In addition, since the device requires, under the control electrode, not only the area for the two floating gates but also some area for the region having no floating gate, the area of one cell increases.

In the third prior art, the area of one memory cell can be reduced. However, since a gap is present between the two floating gates arranged in the source/drain direction, the channel resistance undesirably increases. For this reason, in the third prior art, the absolute value of the read current becomes small, and the margin between determination currents for multivalue data narrows accordingly, so quarternary data determination by the sense amplifier is difficult.

In the second and third prior arts, the source and the drain are controlled to write data in the two floating gates. This requires a large current for write control. In addition, source-drain or source—source interference between adjacent memory cells must be prevented. For this purpose, adjacent memory cells must be insulated from each other by, e.g., an element isolation region. As a result, high integration is impeded because of necessity of the isolation region.

SUMMARY OF THE INVENTION

It is an object of the present invention to provide a nonvolatile semiconductor memory for realizing multivalue storage with a simple arrangement and improved reliability.

It is another object of the present invention to provide a nonvolatile semiconductor memory for realizing multivalue storage without requiring a plurality of power supplies and a large write current.

It is still another object of the present invention to provide a nonvolatile semiconductor memory for realizing multivalue storage with easy multivalue determination in a read.

It is still another object of the present invention to provide a nonvolatile semiconductor memory for realizing multivalue storage while allowing high integration.

In order to achieve the above objects, according to the present invention, there is provided a nonvolatile semiconductor memory comprising a memory cell constituted by at least a first floating gate formed on a semiconductor substrate through a gate insulating film, a second floating gate formed on a region without the first floating gate via the gate insulating film, a first control gate formed on the first floating gate via an insulating film, a second control gate formed on the second floating gate via the insulating film, and a source and a drain which are formed in the semiconductor substrate to sandwich the first and second floating gates.

BRIEF DESCRIPTION OF THE DRAWINGS

FIGS. 4A to 4G are views showing the steps in manufacturing the memory cell shown in FIG. 3;

FIG. 5 is a view for explaining the erase, read, and write operations of the memory cell shown in FIG. 3;

DESCRIPTION OF THE PREFERRED EMBODIMENTS

The embodiments of the present invention will be described below with reference to the accompanying drawings.

First Embodiment

Figure 1A:
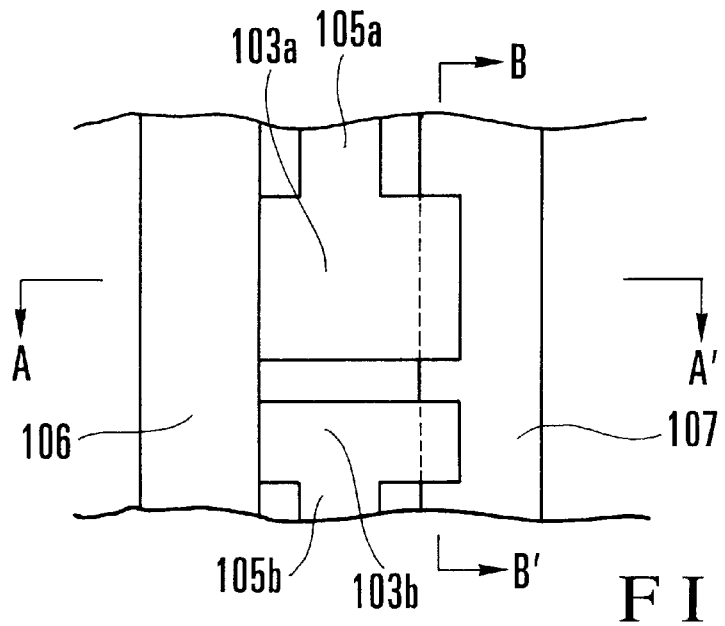
FIG. 1A is a plan view showing the schematic arrangement of a memory cell according to the first embodiment of the present invention.
Figure 1B:
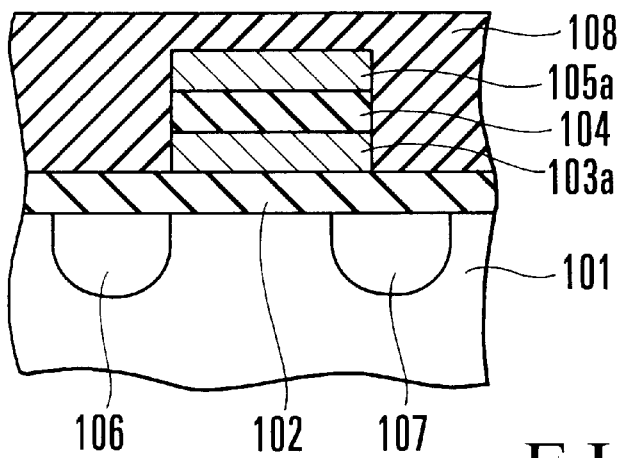
FIGS. 1B and 1C are sectional views taken along a line A–A' and a line B–B' in FIG. 1A, respectively.
Figure 1C:
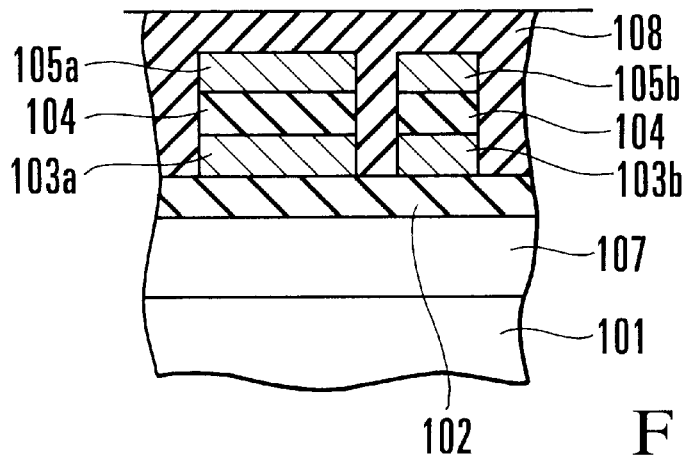

FIGS. 1A to 1C show a memory cell of a nonvolatile semiconductor memory according to the first embodiment of the present invention. FIG. 1A schematically shows the arrangement of the nonvolatile semiconductor memory. FIG. 1B shows a section taken along a line A–A' in FIG. 1A. FIG. 1C shows a section taken along a line B–B' in FIG. 1A.

In the first embodiment, floating gates 103a and 103b consisting of polysilicon are formed on predetermined regions of a semiconductor substrate 101 via a gate insulating film 102, as shown in FIGS. 1A to 1C. Control gates 105a and 105b consisting of, e.g., polysilicon are formed on the floating gates 103a and 103b, respectively, via an insulating film 104. The insulating film 104 has a three-layered structure of, e.g., $SiO_2$, SiN, and $SiO_2$.

As shown in FIGS. 1A and 1C, the area of the floating gate 103a or control gate 105a is different from that of the floating gate 103b or control gate 105b. Advantageously the area of the floating gate 103a may be twice that of the floating gate 103b.

A source 106 and a drain 107 are formed in the semiconductor substrate 101 under the floating gates 103a and 103b by, e.g., ion implantation such that the floating gates 103a and 103b are sandwiched by the source 106 and the drain 107. As shown in FIGS. 1A and 1B, the floating gates 103a and 103b and the control gates 105a and 105b overlap the drain 107 to some extent. An insulating interlayer 108 is formed on the semiconductor substrate 101 including the upper surfaces of the control gates 105a and 105b.

Since two floating gates with different areas are formed in one memory cell, a multivalue operation to be described below can be performed.

Figure 2:
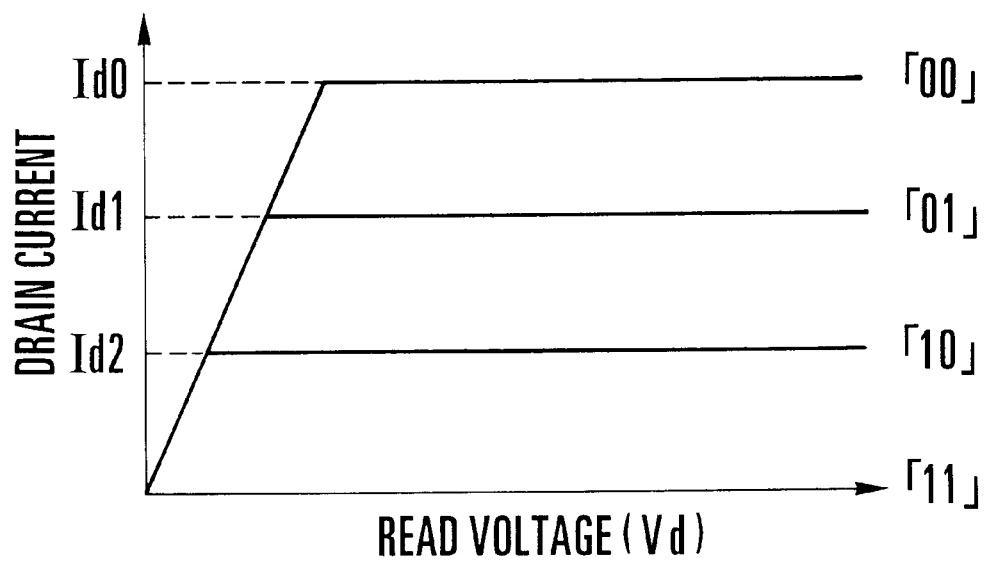
FIG. 2 is a graph showing characteristics in reading/writing information from/in the memory cell shown in FIGS. 1A to 1C.

An erase operation will be described first. A voltage of −16 V is applied to the control gates 105a and 105b shown in FIGS. 1A to 1C to set the semiconductor substrate 101, the source 106, and the drain 107 at 0 V, thereby erasing data. When a voltage of about −16 V is applied to the control gates 105a and 105b, electrons in the floating gates 103a and 103b are moved to the semiconductor substrate 101 side. The electrons in the floating gates 103a and 103b are removed, and an erase state "00" is obtained, as shown in FIG. 2.

When a write using a tunnel current (to be described later) is employed, a state "11" wherein electrons are injected into the floating gates 103a and 103b may be set as the erase state. In this case, a voltage of 16 V is applied to the control gates 105a and 105b shown in FIGS. 1A to 1C to set the semiconductor substrate 101, the source 106, and the drain 107 at 0 V. Electrons are injected from the semiconductor substrate 101 side into the floating gates 103a and 103b, and the state "11" is obtained, as shown in FIG. 2.

A write using a tunnel current when the erase state is "00" will be described next. To write data of level "1" only in the floating gate 103b, a voltage of −4 V is applied to the control gate 105a, a voltage of 9 V is applied to the control gate 105b, and a voltage of −4 V is applied to the drain 107 to set the semiconductor substrate 101 and the source 106 at 0 V. That is, by applying the potentials to the drain 107 and the control gate 105b, this memory cell is selected. The potential difference is formed between the control gate 105b and the drain 107 while that between the control gate 105a and the drain 107 is made zero. As a result, electrons are injected only into the floating gate 103b, and a write state "01" is obtained, as shown in FIG. 2.

To write data of level "1" only in the floating gate 103a, a voltage of 9 V is applied to the control gate 105a, a voltage of −4 V is applied to the control gate 105b, and a voltage of −4 V is applied to the drain 107 to set the semiconductor substrate 101 and the source 106 at 0 V. As a result, electrons are injected into the floating gate 103a, and a write state "10" is obtained, as shown in FIG. 2.

To write data of level "1" in both the floating gates 103a and 103b, a voltage of 9 V is applied to the control gate 105a, a voltage of 9 V is applied to the control gate 105b, and a voltage of −4 V is applied to the drain 107 to set the semiconductor substrate 101 and the source 106 at 0 V. As a result, electrons are injected into the floating gates 103a and 103b, and a write state "11" is obtained, as shown in FIG. 2.

A write using a tunnel current when the erase state is "11" will be described next. To write data of level "0" only in the floating gate 103a, a voltage of −9 V is applied to the control gate 105a, a voltage of 4 V is applied to the control gate 105b, and a voltage of 4 V is applied to the drain 107 to set the semiconductor substrate 101 and the source 106 at 0 V. That is, by applying the potentials to the drain 107 and the control gate 105a, this memory cell is selected. The potential difference is formed between the control gate 105a and the drain 107 while that between the control gate 105b and the drain 107 is made zero. As a result, only electrons in the floating gate 103a are removed to the drain 107, and the write state "01" is obtained, as shown in FIG. 2.

To write data of level "0" only in the floating gate 103b, a voltage of 0 V is applied to the control gate 105a, a voltage of −9 V is applied to the control gate 105b, and a voltage of 4 V is applied to the drain 107 to set the semiconductor substrate 101 and the source 106 at 0 V. As a result, electrons are removed from the floating gate 103b, and the write state "10" is obtained, as shown in FIG. 2.

To write data of level "0" in both the floating gates 103a and 103b, a voltage of −9 V is applied to the control gate 105a, a voltage of −9 V is applied to the control gate 105b, and a voltage of 4 V is applied to the drain 107 to set the semiconductor substrate 101 and the source 106 at 0 V. As a result, electrons are removed from the floating gates 103a and 103b, and the write state "00" is obtained, as shown in FIG. 2.

A write using hot electrons when the erase state is "00" will be described next. To write data of level "1" only in the floating gate 103b, a voltage of 0 V is applied to the control gate 105a, a voltage of 12 V is applied to the control gate 105b, and a voltage of 6 V is applied to the drain 107 to set the semiconductor substrate 101 and the source 106 at 0 V. That is, by applying the potentials to the drain 107 and the control gate 105b, this memory cell is selected. The potential difference is formed between the control gate 105a and the semiconductor substrate 101 while that between the control gate 105a and the semiconductor substrate 101 is made zero. As a result, high-energy electrons are injected only into the floating gate 103b, and the write state "01" is obtained, as shown in FIG. 2.

To write data of level "1" only in the floating gate 103a, a voltage of 12 V is applied to the control gate 105a, a voltage of 0 V is applied to the control gate 105b, and a voltage of 6 V is applied to the drain 107 to set the substrate 101 and the source 106 at 0 V. As a result, high-energy electrons are injected only into the floating gate 103a, and the write state "10" is obtained, as shown in FIG. 2.

To write data of level "1" in both the floating gates 103a and 103b, a voltage of 12 V is applied to the control gate 105a, a voltage of 12 V is applied to the control gate 105b, and a voltage of 6 V is applied to the drain 107 to set the substrate 101 and the source 106 at 0 V. As a result, electrons are injected into the floating gates 103a and 103b, and the write state "11" is obtained, as shown in FIG. 2.

In a read, the drain voltage is set at 1 V, the source voltage is set at 0 V, and a voltage of 3.3 V is applied to the control gates 105a and 105b. As shown in FIG. 2, when "00" is written in the memory cell, a drain current Id0 is obtained. When "11" is written in the memory cell, the drain current rarely flows.

Since the floating gate 103a has a larger area than that of the floating gate 103b, the drain current changes between the state "01" and the state "10". Electrons are injected at the same charge density, and therefore, as the area increases, the drain current decreases. For this reason, when "01" is written in the memory cell, a drain current Id1 is obtained. When "10" is written in the memory cell, a drain current Id2 is obtained. The current Id1 is larger than the current Id2.

As described above, according to the first embodiment, quarternary data can be stored in one memory cell. Since the multivalue data is realized by the structure of the memory cell itself, multivalue data need not be realized by the circuit operation, and the load on the peripheral circuits decreases. In the nonvolatile semiconductor memory of the first embodiment, the two sets of floating gates and control gates are in contact with the same source and drain. Unlike the second or third prior art, no gap is generated between the two floating gates in the direction of channel between the source and the drain. Therefore, the channel resistance can be prevented from increasing.

In addition, unlike the second prior art, an area more than need is not required to arrange the floating gates, and the memory cell size can be prevented from excessively increasing.

According to the first embodiment, one write control circuit is arranged on the drain side, and two write control circuits are arranged on the control gate side. The write control circuits on the control gate side can be controlled with a smaller current than that for the control circuit on the drain or source side and can be formed from a small transistor. The number of write control circuits is equal to that in the second or third prior art. However, since the transistor can be made small, the chip size can be reduced.

The source potential is kept at 0 V in the erase, the write, and the read, so no control circuit is required. Even adjacent memory cells connected to different drains can share the source and need not be isolated from each other. This allows high integration, and the degree of integration can be increased as compared to the prior art.

According to the first embodiment, since contents in the two floating gate prepared in one memory cell can be read at once through the common drain, the read rate can be increased.

Second Embodiment

Figure 3:
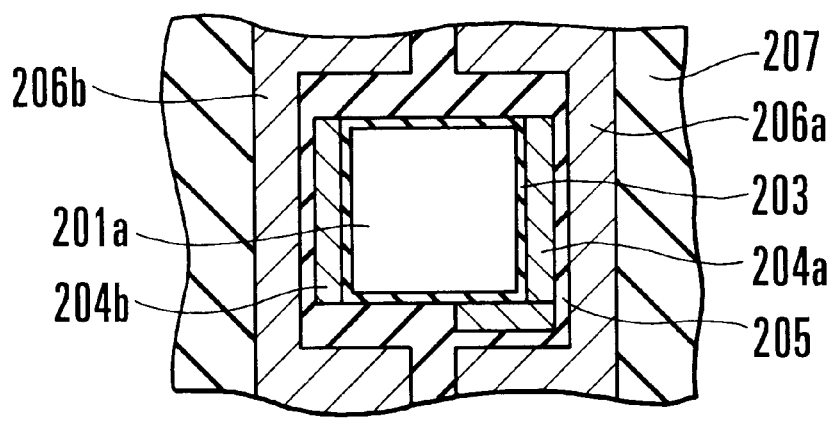
FIG. 3 is a cross-sectional view showing the schematic arrangement of a memory cell according to the second embodiment of the present invention.

FIG. 3 schematically shows the arrangement of a nonvolatile semiconductor memory according to the second embodiment of the present invention, which is viewed from the upper side. FIG. 3 shows a memory cell of the nonvolatile semiconductor memory.

In the second embodiment, as shown in FIG. 3, a gate insulating film 203 is formed around a columnar portion (pillar: channel portion) 201a, and floating gates 204a and 204b are formed on the side surfaces of the columnar portion 201a.

In the second embodiment, the floating gate 204a has a larger area than that of the floating gate 204b. Advantageously the floating gate 204a may have an area twice that of the floating gate 204b.

Control gates 206a and 206b as word lines are formed on the floating gates 204a and 204b, respectively, via an insulating film 205. The control gates 206a and 206b are covered with an insulating interlayer 207.

A method of manufacturing the memory cell will be described below.

As shown in FIG. 4A, a p-type semiconductor substrate 201 is, e.g., dry-etched to form the pillar 201a on the substrate. After this, As or the like is ion-implanted at 70 KeV and $5 \times 10^{15}$ cm$^{-2}$ to form a source 202a and a drain 202b. After ion implantation, the resultant structure is heated at 950° C. in a water vapor atmosphere to form a sacrificial oxide film having a thickness of about 40 nm. With this process, the source 202a and the drain 202b which have an impurity concentration of about $10^{20}$ cm$^{-3}$ are formed.

After the sacrificial oxide film is removed, the resultant structure is heated at 850° C. in the water vapor atmosphere to form the gate insulating film 203 having a thickness of about 10 nm.

As shown in FIG. 4B, polysilicon is deposited on the gate insulating film 203 to a thickness of about 150 nm by CVD. The resultant structure is heated to about 850° C. in a POCl$_3$ atmosphere to diffuse P, so that a polysilicon film 204 doped with P as an impurity is formed.

A resist mask is formed by known photolithography. The polysilicon film 204 is selectively removed by anisotropic dry etching such as RIE to form the floating gates 204a and 204b on the side surfaces of the pillar 201a via the gate insulating film 203, as shown in FIG. 4C. When viewed from the upper side, the area of the floating gate 204a is larger than that of the floating gate 204b, as shown in FIG. 4C'.

Figures 4D, 4E:
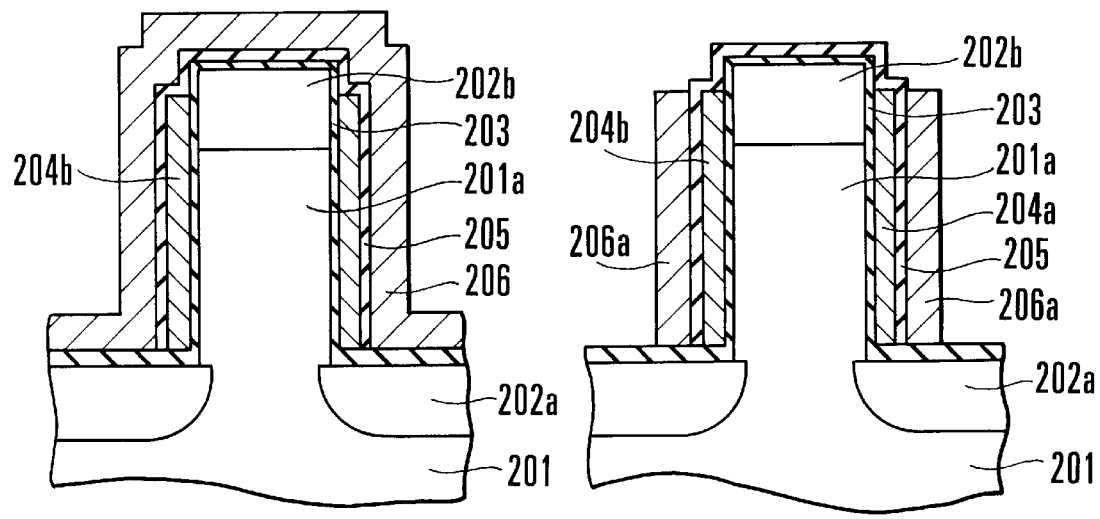
Figure 4E:
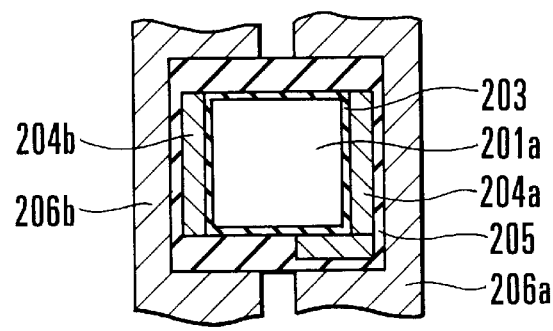

As shown in FIG. 4D, after the insulating film 205 is formed, polysilicon is deposited to a thickness of about 150 nm by CVD. The resultant structure is heated to about 850° C. in the POCl$_3$ atmosphere to diffuse P. Next, a WSi film is deposited to about 150 nm by sputtering to form a polycide film 206.

The insulating film 205 has a three-layered structure of, e.g., SiO$_2$, SiN, and SiO$_2$. The polycide film 206 has a two-layered structure of polysilicon and WSi, as described above.

A resist mask is formed by known photolithography. The polycide film 206 is selectively removed by anisotropic dry etching such as RIE to form the control gates 206a and 206b, as shown in FIG. 4E.

When viewed from the upper side, the control gates 206a and 206b have a shape as shown in FIG. 4E'. The floating gate 204a is sandwiched by the pillar 201a and the control gate 206a, and the floating gate 204b is sandwiched by the pillar 201a and the control gate 206b. The floating gate 204b never exist between the control gate 206a and the pillar 201a.

Figure 4F:
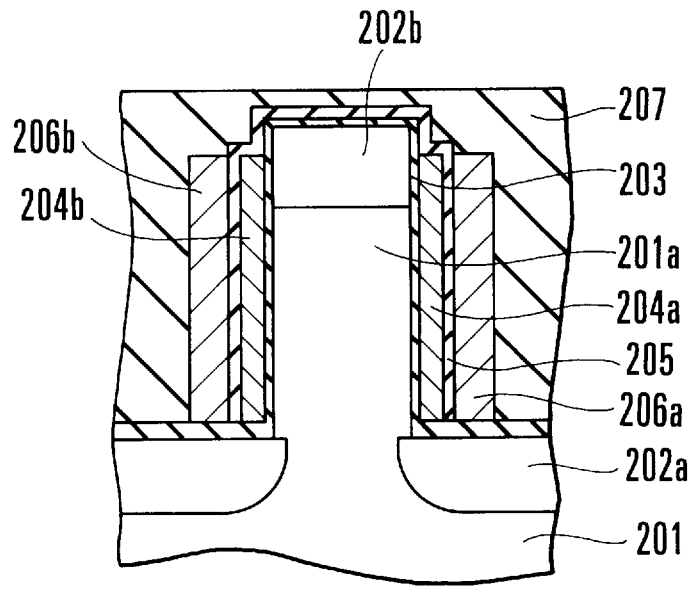
Figure 4G:
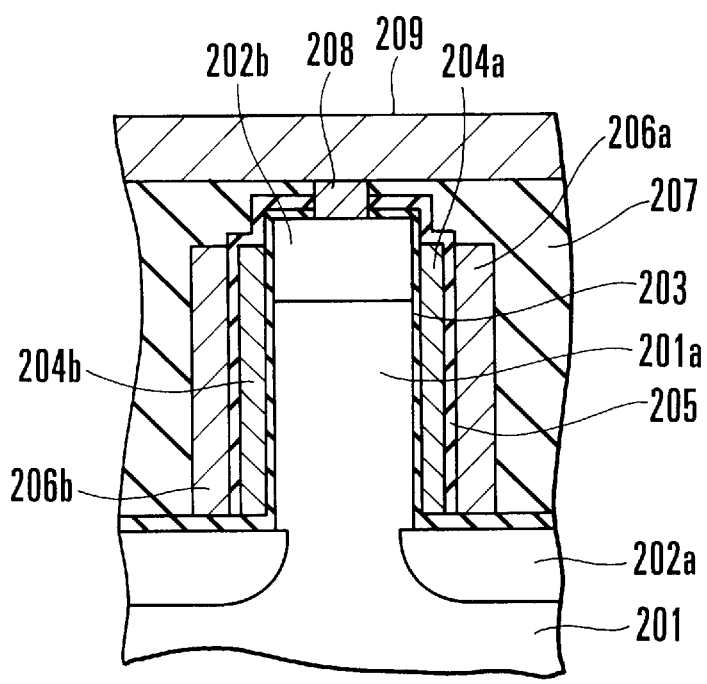
Figure 6:
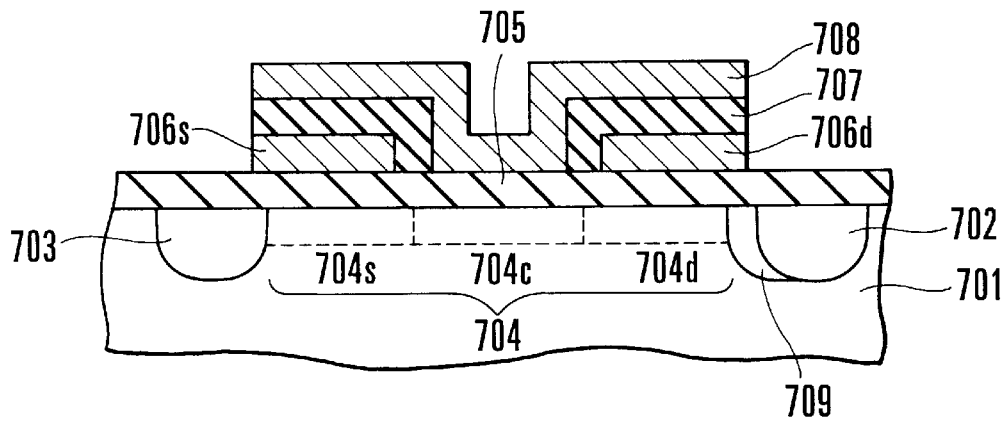
FIG. 6 is a longitudinal sectional view showing a conventional memory cell.
Figure 7:
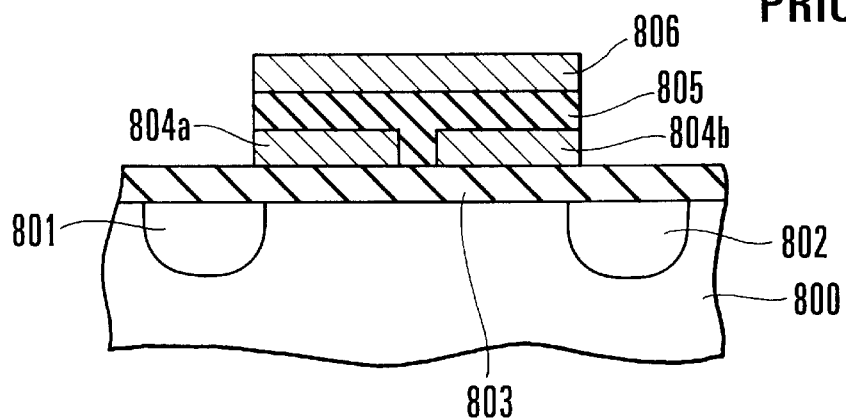
FIG. 7 is a longitudinal sectional view showing another conventional memory cell.

As shown in FIG. 4F, the insulating interlayer 207 is formed, and a contact hole is formed on the pillar 201a. A barrier metal consisting of titanium nitride is formed on the pillar 201a exposed to the bottom surface of the contact hole. The contact hole is filled with a plug 208, and an interconnection layer 209 consisting of aluminum is formed, as shown in FIG. 4G. The interconnection layer 209 serves as a bit line.

In the above-described manner, a flash memory in which the floating gates 204a and 204b with an area ratio of about 2:1 are formed in one memory cell, and the floating gates 204a and 204b have the control gates 206a and 206b, respectively, is obtained.

In the second embodiment as well, since two floating gates having different areas are formed in one memory cell, a multivalue operation to be described below can be performed.

An erase operation will be described first. A voltage of −16 V is applied to a terminal CG1 connected to the control gate 206a and a terminal CG2 connected to the control gate 206b shown in FIG. 5, thereby erasing data. When a voltage of about −16 V is applied to the control gates, electrons in the floating gates are moved to the substrate side. The electrons in the floating gates are removed, and an erase state "00" is obtained, as shown in FIG. 2. In the second embodiment as well, a state "11" wherein electrons are injected into both floating gates may be set as the erase state, as in the first embodiment.

A write using a tunnel current when the erase state is "00" will be described next.

To write data of level "1" only in the floating gate 204b, a potential of −4 V is applied to the terminal CG1 connected to the control gate 206a, a potential of 9 V is applied to the terminal CG2 connected to the control gate 206b, a potential of −4 V is applied to the drain 202b, and a potential of 0 V is applied to the substrate 201 and the source 202a (FIG. 5). That is, by applying the potentials to the drain 202b and the control gate 206a, this memory cell is selected. The potential difference is formed between the control gate 206b and the drain 202b while that between the control gate 206a and the drain 202a is made zero. As a result, electrons are injected only into the floating gate 204b, and a write state "01" is obtained, as shown in FIG. 2.

To write data of level "1" only in the floating gate 204a, a potential of 9 V is applied to the terminal CG1, a potential of −4 V is applied to the terminal CG2, a potential of −4 V is applied to the drain 202b, and a potential of 0 V is applied to the substrate 201 and the source 202a. As a result, electrons are injected into the floating gate 204a, and a write state "10" is obtained, as shown in FIG. 2.

To write data of level "1" in both the floating gates 204a and 204b, a potential of 9 V is applied to the terminal CG1, a potential of 9 V is applied to the terminal CG2, a potential of −4 V is applied to the drain 202b, and a potential of 0 V is applied to the substrate 201 and the source 202a. As a result, electrons are injected into the floating gates 204a and 204b, and a write state "11" is obtained, as shown in FIG. 2.

The write using a tunnel current when the erase state is "11" can also be performed as in the first embodiment.

In a read, the drain voltage is set at 1 V, and a voltage of 3.3 V is applied to the control gates 206a and 206b. As shown in FIG. 2, when "00" is written in the memory cell, a drain current Id0 is obtained. When "11" is written in the memory cell, no drain current flows.

Since the floating gate 204a has a larger area than that of the floating gate 204b, the drain current changes between the state "01" and the state "10". For this reason, when "01" is written in the memory cell, a drain current Id1 is obtained. When "10" is written in the memory cell, a drain current Id2 is obtained.

A write using channel hot electrons when the erase state is "00" will be described next. To write data of level "1" only in the floating gate 204b, a potential of 0 V is applied to the terminal CG1 connected to the control gate 206a, a potential of 12 V is applied to the terminal CG2 connected to the control gate 206b, a potential of 6 V is applied to the drain 202b, and a potential of 0 V is applied to the substrate 201 and the source 202a (FIG. 5). That is, by applying the potentials to the drain 202b and the control gate 206b, this memory cell is selected. The potential difference is formed between the control gate 206b and the pillar 201a (substrate) while that between the control gate 206a and the drain 202b is made zero. As a result, electrons are injected only into the floating gate 204b, and the write state "01" is obtained, as shown in FIG. 2.

To write data of level "1" only in the floating gate 204a, a potential of 12 V is applied to the terminal CG1, a potential of 0 V is applied to the terminal CG2, a potential of 6 V is applied to the drain 202b, and a potential of 0 V is applied to the substrate 201 and the source 202a. As a result, electrons are injected into the floating gate 204a, and the write state "10" is obtained, as shown in FIG. 2.

To write data of level "1" in both the floating gates 204a and 204b, a potential of 12 V is applied to the terminal CG1, a potential of 12 V is applied to the terminal CG2, a potential of 6 V is applied to the drain 202b, and a potential of 0 V is applied to the substrate 201 and the source 202a. As a result, electrons are injected into the floating gates 204a and 204b, and the write state "11" is obtained, as shown in FIG. 2.

As described above, according to the second embodiment, quarternary data can be stored in one memory cell, as in the above-described first embodiment. Therefore, the amount of information to be stored can be increased without increasing the number of memory cells.

Since the multivalue data is realized by the structure of the memory cell itself, multivalue data need not be realized by the circuit operation, and the load on the peripheral circuits decreases.

In the nonvolatile semiconductor memory of the second embodiment as well, the two sets of floating gates and control gates are not arranged in the direction of source and drain. Since no gap is generated between the two floating gates in the direction of source and drain, the channel resistance can be prevented from increasing.

Since the memory cell of the second embodiment is of a vertical type, the degree of integration can be improved more than the first embodiment.

In the second embodiment as well, write control is performed at the drain and the control gates. For this reason, write control can be performed with a small current. In addition, adjacent memory cells can share the source and need not be isolated from each other.

In the second embodiment as well, since contents in the two floating gate prepared in one memory cell can be read at once, the read rate can be increased.

In the first and second embodiments, the two floating gates in one memory cell have different areas. However, the present invention is not limited to this. Two floating gates having the same area may be formed in one memory cell. In this case, the same drain current flows in correspondence with data "01" and "10" in the read, so ternary data can be stored in one memory cell.

In the first and second embodiments, when the ratio of the areas of the two floating gates is set at 1:2, a more stable read can be performed. This is because when the areas of the two floating gates have a ratio of 1:2, the read potential differences at the control gate for "00", "01", "10", and "11" are set at an equal interval.

As has been described above, a nonvolatile semiconductor memory of the present invention comprises a memory cell constituted by at least a first floating gate formed on a semiconductor substrate through a gate insulating film, a second floating gate formed on a region without the first floating gate via the gate insulating film, a first control gate formed on the first floating gate via an insulating film, a second control gate formed on the second floating gate via the insulating film, and a source and a drain which are formed in the semiconductor substrate to sandwich the first and second floating gates.

A nonvolatile semiconductor memory of the present invention comprises a vertical type memory cell constituted by at least a channel portion vertically formed on a semiconductor substrate, a drain and source which are formed at the upper and lower positions of the channel portion to form a channel in the channel portion, a first floating gate formed on a part of the side portion of the channel portion via a gate insulating film, a second floating gate formed on the side portion of the channel portion on a region not having the first floating gate, a first control gate formed on the outer side of the first floating gate via an insulating film, and a second control gate formed on the outer side of the second floating gate via the insulating film.

With the above arrangement, two or more states can be formed in the channel formed in the channel portion depending on the presence/absence of electrons in the first and second floating gates.

Therefore, according to the present invention, at least ternary data can be stored in one memory cell. The amount of information to be stored can be increased without increasing the number of memory cells. Since multivalue data is not realized by the circuit operation, the amount of charges to be stored in one floating gate need not be changed, and the load on the peripheral circuits of the memory cell is minimized.

According to the present invention, the two sets of floating gates and control gates are not arranged in the direction of source and drain. Since no gap is generated between the two floating gates in the direction of source and drain, the channel resistance is prevented from increasing. No area more than need is required to arrange the floating gates, the memory cell size can be prevented from excessively increasing.

According to the present invention, write control is performed at the drain and the control gates. For this reason, write control can be performed with a small current. In addition, adjacent memory cells can share the source and need not be isolated from each other. Since contents in the two floating gate prepared in one memory cell can be read at once, the read rate can be increased.

Since the memory cell is of a vertical type, the degree of integration can be further improved.

A nonvolatile semiconductor memory of the present invention comprises two memory cells constituted by at least a first floating gate formed on a semiconductor substrate via a gate insulating film, a second floating gate formed on a region not having the first floating gate via the gate insulating film, a first source and first drain which are formed in the semiconductor substrate to parallelly sandwich the first and second floating gates, a third floating gate formed via the gate insulating film to oppose the first floating gate via the first source, a fourth floating gate formed via the gate insulating film to oppose the second floating gate via the first source, a second drain formed in the semiconductor substrate to oppose the first source such that the third and fourth floating gates are parallelly sandwiched by the second drain and the first source, a first control gate formed on the first and third floating gates via an insulating film, and a second control gate formed on the second and fourth floating gates via the insulating film.

With the above arrangement, two or more states can be formed in the channel formed in the channel portion depending on the presence/absence of electrons in the first and second floating gates.

Therefore, according to the present invention, at least ternary data can be stored in one memory cell. The amount of information to be stored can be increased without increasing the number of memory cells. Since multivalue data is not realized by the circuit operation, the amount of charges to be stored in one floating gate need not be changed, and the load on the peripheral circuits of the memory cell is minimized.

In addition, since the adjacent cells share the source, the degree of integration can be further improved.

What is claimed is:

1. A nonvolatile semiconductor memory comprising a memory cell constituted by at least a first floating gate formed on a semiconductor substrate through a gate insulating film, a second floating gate formed on a region without said first floating gate via said gate insulating film, a first control gate formed on said first floating gate via an insulating film, a second control gate formed on said second floating gate via said insulating film, and a source and a drain which are formed in said semiconductor substrate to sandwich said first and second floating gates.

2. A memory according to claim 1, wherein said first floating gate and said second floating gate partially overlap said drain.

3. A memory according to claim 1, wherein said first floating gate has a larger area than that of said second floating gate.

4. A memory according to claim 1, wherein said source has the same voltage in a write, a read, and an erase.

5. A memory according to claim 1, wherein said first floating gate has an area twice as large as that of said second floating gate.

6. A nonvolatile semiconductor memory comprising two memory cells constituted by at least a first floating gate formed on a semiconductor substrate via a gate insulating film, a second floating gate formed on a region not having said first floating gate via said gate insulating film, a first source and first drain which are formed in said semiconductor substrate to parallelly sandwich said first and second floating gates, a third floating gate formed via said gate insulating film to oppose said first floating gate via said first source, a fourth floating gate formed via said gate insulating film to oppose said second floating gate via said first source, a second drain formed in said semiconductor substrate to oppose said first source such that said third and fourth floating gates are parallelly sandwiched by said second drain and said first source, a first control gate formed on said first and third floating gates via an insulating film, and a second control gate formed on said second and fourth floating gates via said insulating film.

7. A memory according to claim 6, wherein each of said first and third floating gates and each of said second and fourth floating gates partially overlap a corresponding one of said first and second drains.

8. A memory according to claim 6, wherein each of said first and third floating gates has a larger area as that of a corresponding one of said second and fourth floating gates.

9. A memory according to claim 6, wherein said source has the same voltage in a write, a read, and an erase.

10. A memory according to claim 6, wherein each of said first and third floating gates has an area twice as large as that of a corresponding one of said second and fourth floating gates.

* * * * *